(12) United States Patent
Chan et al.

(10) Patent No.: US 11,422,964 B2
(45) Date of Patent: Aug. 23, 2022

(54) IMAGE PROCESSING CHIP

(71) Applicant: REALTEK SEMICONDUCTOR CORP., Hsinchu (TW)

(72) Inventors: Chun-Chieh Chan, Hsinchu (TW); Wei-Lun Huang, Tainan (TW); Chia-Lung Hung, New Taipei (TW); Yung-Ming Lin, Taichung (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 14 days.

(21) Appl. No.: 16/921,996

(22) Filed: Jul. 7, 2020

(65) Prior Publication Data

US 2021/0133136 A1 May 6, 2021

(30) Foreign Application Priority Data

Nov. 1, 2019 (TW) ................................ 108139605

(51) Int. Cl.
*G06F 13/38* (2006.01)
*G06F 13/40* (2006.01)
*H03M 1/00* (2006.01)

(52) U.S. Cl.
CPC ........ *G06F 13/385* (2013.01); *G06F 13/4022* (2013.01); *H03M 1/001* (2013.01);
(Continued)

(58) Field of Classification Search
CPC .... G06F 13/382; G06F 13/385; G06F 13/387; G06F 13/4004; G06F 13/4022;
(Continued)

(56) References Cited

U.S. PATENT DOCUMENTS 10,002,105 B2 * 6/2018 Chen .................... G06F 13/4022
11,113,224 B2 * 9/2021 Li ........................... G09G 5/006
(Continued)

FOREIGN PATENT DOCUMENTS

CN 108701107 A 10/2018
TW 201914291 A 4/2019

OTHER PUBLICATIONS

"Up Close and Personal With High-Speed Crosspoint Switches". Electronic Design. Online Oct. 11, 1998. Retrieved from Internet Sep. 16, 2021. <https://www.electronicdesign.com/technologies/analog/article/21768132/up-close-and-personal-with-highspeed-crosspoint-switches>. (Year: 1998).*

(Continued)

*Primary Examiner* — Thomas J. Cleary
(74) *Attorney, Agent, or Firm* — Li & Cai Intellectual Property (USA) Office (57) ABSTRACT

An image processing chip includes a first interface port, a second interface port, a first upstream facing port (UFP) physical layer module, a first configuration channel detection module, a second upstream facing port (UFP) physical layer module, a second configuration channel detection module, a display signal processing module, a USB signal processing module, an image signal output port and a USB signal output port. The first configuration channel detection module is coupled to the first interface port through a first configuration channel pair, and configured to, after being communicated through a USB specification, detect a first configuration channel signal of a first input signal group to determine a signal type of the first input signal group, and control the first UFP physical layer module to output the first input signal group with a first signal configuration according to the signal type of the first input signal group.

10 Claims, 5 Drawing Sheets

(52) U.S. Cl.
CPC ............... *G06F 2213/0042* (2013.01); *G06F 2213/3812* (2013.01)

(58) Field of Classification Search
CPC ............ G06F 13/4027; G06F 13/4072; G06F 13/4282; H03M 1/001; H03M 1/02
See application file for complete search history.

(56) References Cited

U.S. PATENT DOCUMENTS

| | | | | |
|---|---|---|---|---|
| 2010/0064076 | A1* | 3/2010 | Chen .................. | G06F 13/4022 710/63 |
| 2014/0181325 | A1* | 6/2014 | Hundal ................ | G06F 13/126 710/5 |
| 2015/0331826 | A1* | 11/2015 | Ghosh ................ | G06F 13/4027 710/313 |
| 2016/0110305 | A1* | 4/2016 | Hundal ................ | G06F 13/387 710/316 |
| 2016/0127671 | A1* | 5/2016 | Hundal ............ | H04N 21/43632 348/723 |
| 2016/0216750 | A1* | 7/2016 | Hundal ............... | G06F 13/4068 |
| 2017/0046289 | A1* | 2/2017 | Hundal ............... | G06F 13/4282 |
| 2017/0364465 | A1* | 12/2017 | Tsukamoto ......... | G06F 13/4022 |
| 2018/0060270 | A1* | 3/2018 | Schnell ............... | G06F 13/4022 |
| 2018/0143932 | A1* | 5/2018 | Lawless .............. | G06F 13/4068 |
| 2019/0068894 | A1* | 2/2019 | Rathore ................ | H04N 9/641 |
| 2019/0075338 | A1* | 3/2019 | Liao .................... | H04N 21/2389 |
| 2019/0082141 | A1* | 3/2019 | Chen ..................... | H04N 7/104 |
| 2019/0108148 | A1* | 4/2019 | Paganini ................ | G06F 13/20 |
| 2019/0121771 | A1* | 4/2019 | Kadgi ................... | G06F 1/1654 |
| 2019/0373211 | A1* | 12/2019 | Chen .................... | H04N 5/268 |
| 2020/0233822 | A1* | 7/2020 | Zheng .................. | G06F 13/385 |
| 2020/0242064 | A1* | 7/2020 | Li ........................ | G06F 13/4022 |
| 2020/0410630 | A1* | 12/2020 | Gopalakrishnan ........ | G06T 1/20 |
| 2021/0224216 | A1* | 7/2021 | Huang ................ | G06F 13/4282 |

OTHER PUBLICATIONS

Jphugan. "Demystifying USB-C and Thunderbolt, i.e. adapter and dock capabilities/limitations". Dell Inc. Online Aug. 2, 2017. Retrieved from Internet? Jan. 2022. <https://www.dell.com/community/Laptops-General-Read-Only/Demystifying-USB-C-and-Thunderbolt-i-e-adapter-and-dock/td-p/5153006>. (Year: 2017).*

Steve. "Explaining 4K 60Hz Video Through USB-C Hub". Big Mess o' Wires. Online May 19, 2019. Retrieved from Internet Jan. 7, 2022. <https://www.bigmessowires.com/2019/05/19/explaining-4k-60hz-video-through-usb-c-hub/>. (Year: 2019).*

* cited by examiner

IMAGE PROCESSING CHIP

CROSS-REFERENCE TO RELATED PATENT APPLICATION

This application claims the benefit of priority to Taiwan Patent Application No. 108139605, filed on Nov. 1, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an image processing chip, and more particularly to an image processing chip having built-in digital multiplexers.

BACKGROUND OF THE DISCLOSURE

At present, with the vigorous development of universal serial bus (USB) Type-C®, many USB functions have begun to be added to display products. For example, multiple USB ports can be seen on products such as TV, monitors, and the like.

In addition to making it easier for users to access devices using the USB ports, USB Type-C can also transmit video signals from DisplayPort (DP), and the biggest advantage of such configuration is that four pairs of high-speed signal channels defined on the Type-C connector can be applied according to requirements.

A part of the signal defined for the DisplayPort can satisfy signal formats required for display after image processing. For products with multiple upstream facing port (UFP) USB Type-C ports, only a single downstream facing port (DFP) may be required. In other words, the same USB device can be accessed by different USB masters through a switching mechanism.

In an existing circuit architecture, one or more multiplexers for switching USB signals can be added to a printed circuit board (PCB). Such products with a pure USB signal multiplexer can be divided into two types.

A first type of multiplexer is a lane-to-lane multiplexer (L-to-L Mux), which may be a multiplexer that switches from four pairs of channels to two pairs of channels, or six pairs of channels to two pairs of channels. However, this design does not have image processing capabilities. In practice, if the switching mechanism of port-to-port needs to be achieved, multiple lane-to-lane multiplexers must be used. In order to achieve the purpose, not only is an area used on the PCB relatively large, but it is also difficult to avoid issues such as signals having to pass through layers of the PCB, resulting in poor signal quality and affecting compatibility.

A second type of multiplexer, namely the port-to-port multiplexer, can reduce the area used on the PCB and avoid an issue of signal penetration compared to an architecture using multiple lane-to-lane multiplexers, but at present its application is limited to adapting multiple ports to a single port. When the above two types of multiplexers are applied to the USB Type-C connector, the multiplexers cannot be used for the type defined by the four pairs of high-speed signal channels, because the multiplexers cannot actively or passively distinguish between USB signal channels and DP signal channels, and hence, it is impossible to provide signals to the corresponding DP chip and USB chip directly on the PCB for processing.

Therefore, there is an urgent need for an image processing chip capable of reducing costs and reducing the area used on the PCB while maintaining signal quality.

SUMMARY OF THE DISCLOSURE

In response to the above-referenced technical inadequacies, the present disclosure provides an image processing chip capable of reducing the cost, reducing the area used on the PCB, and maintaining the signal quality.

In one aspect, the present disclosure provides an image processing chip including a first interface port, a second interface port, a first upstream facing port (UFP) physical layer module, a first configuration channel detection module, a second upstream facing port (UFP) physical layer module, a second configuration channel detection module, a display signal processing module, a USB signal processing module, an image signal output port and a USB signal output port. The first interface port is used for connecting a first input signal group, and the second interface port is used for connecting a second input signal group. The first UFP physical layer module is coupled to the first interface port through a plurality of first high-speed signal channels. The first configuration channel detection module is coupled to the first interface port through a first configuration channel pair, and configured to, after being communicated through a USB specification, detect a first configuration channel signal of the first input signal group to determine a signal type of the first input signal group, and control the first UFP physical layer module to output the first input signal group with a first signal configuration according to the signal type of the first input signal group. The UFP physical layer module is coupled to the second interface port through a plurality of second high-speed signal channels. The second configuration channel detection module is coupled to the second interface port through a second configuration channel pair, and configured to, after being communicated through the USB specification, detect a second configuration channel signal of the second input signal group to determine a signal type of the second input signal group, and control the second UFP physical layer module to output the second input signal group with a second signal configuration according to the signal type of the second input signal group. The display signal processing module is configured to receive and process a plurality of display signals from the first UFP physical layer module and the second UFP physical layer module, and generate a plurality of processed image signals. The USB signal processing module is configured to receive and process a plurality of USB signals from the first UFP physical layer module and the second UFP physical layer module, and generate a plurality of processed USB signals. The image signal output port is configured to output the plurality of processed image signals. The USB signal output port is configured to output the plurality of processed USB signals.

In another aspect, the present disclosure provides an image processing chip including an image signal input port, a USB signal input port, a display signal processing module, a USB signal processing module, a first interface port, a second interface port, a first UFP physical layer module, a first configuration channel detection module, a second UFP physical layer module, and a second configuration channel detection module. The image signal input port is configured to receive a plurality of input display signals. The USB signal input port is configured to receive a plurality of input USB signals. The display signal processing module is configured to receive and process the input display signals from the image signal input port, and generate a plurality of processed image signals. The USB signal processing module is configured to receive and process the plurality of input USB signals from the USB signal input port, and generate a plurality of processed USB signals. The first interface port is configured to transmit with a first device through a first output signal group. The second interface port is configured to transmit with a second device through a second output signal group. The first UFP physical layer module is configured to receive the plurality of processed image signals and the plurality of processed USB signals, and coupled to the first interface port through a plurality of first high-speed signal channels. The first configuration channel detection module is coupled to the first interface port through a first configuration channel pair, configured to detect a first configuration channel signal of the first output signal group to determine a signal type of the first output signal group, and control the first UFP physical layer module to output a plurality of first image signals of the plurality of processed image signals and a plurality of first USB signal of the plurality of processed USB signals as the first output signal group with a first signal configuration according to the signal type of the first output signal group. The second UFP physical layer module is configured to receive the plurality of processed image signals and the plurality of processed USB signals, and coupled to the second interface port through a plurality of second high-speed signal channels. The second configuration channel detection module is coupled to the second interface port through a second configuration channel pair, configured to detect a second configuration channel signal of the second output signal group to determine a signal type of the second input signal group, and control the second UFP physical layer module to output a plurality of second image signals of the plurality of processed image signals and a plurality of second USB signal outputs of the processed USB signals as the second output signal group with a second signal configuration according to a signal type of the second input signal group.

Therefore, the image processing chip provided by the present disclosure can reduce the area used on the PCB, reduce costs, reduce signal penetration by using built-in digital multiplexers, and can reduce an influence of crosstalk caused by high-speed signals compared to the existing technology that uses analog multiplexers.

In addition, the image processing chip provided by the present disclosure can achieve arbitrary switching between multiple UFP ports and multiple DFP ports, and the application is not limited to a form of USB.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1:
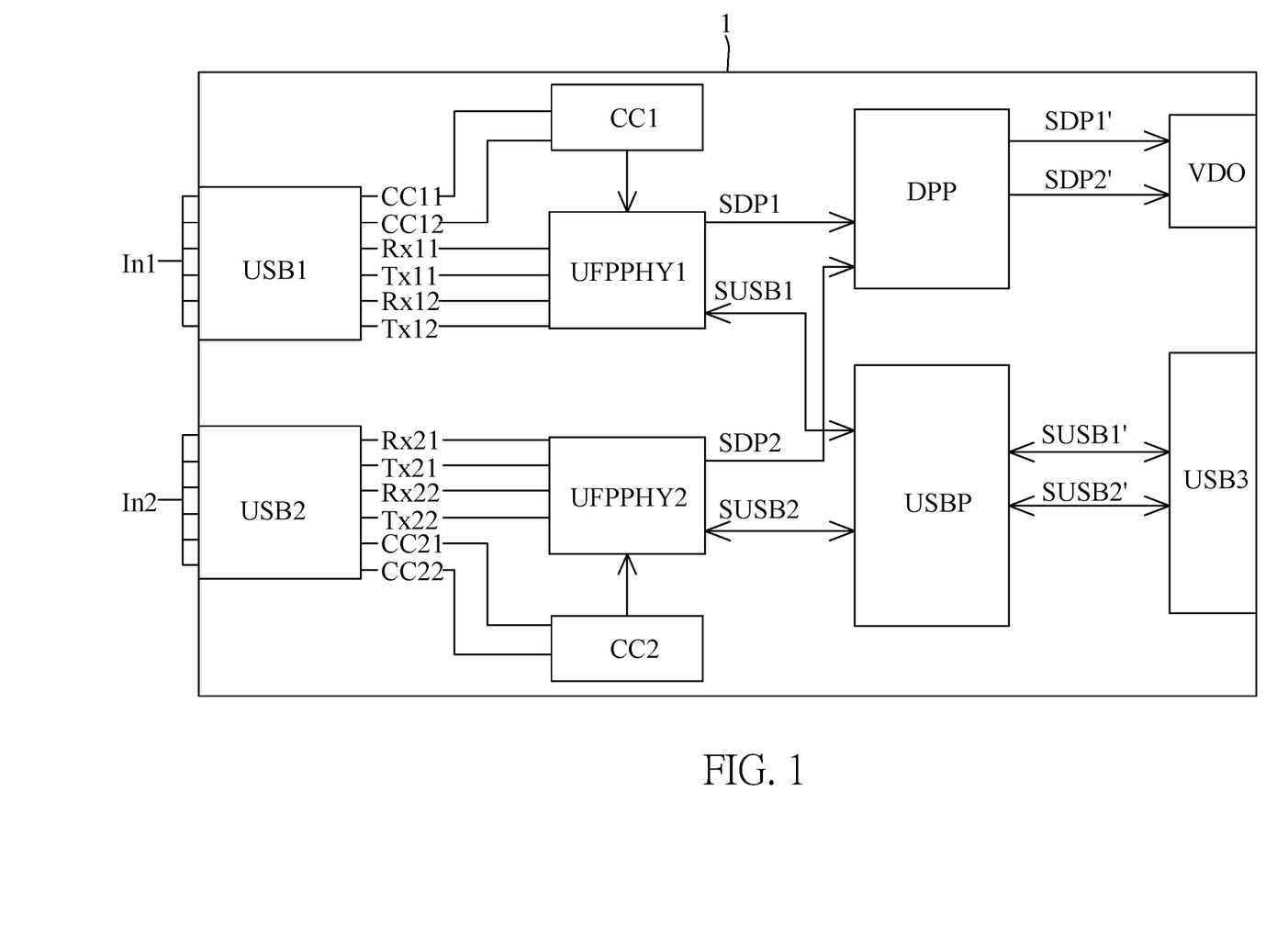
FIG. 1 is a circuit layout diagram of an image processing chip according to a first embodiment of the present disclosure.

In the image processing chip architecture provided by the present disclosure, the above-mentioned disadvantages are mainly solved by using built-in digital multiplexers. FIG. 1 is a circuit layout diagram of an image processing chip according to a first embodiment of the present disclosure. Reference is made to FIG. 1, a first embodiment of the present disclosure provides an image processing chip 1 including a first interface port USB1, a second interface port USB2, a first upstream facing port (UFP) physical layer module UFPPHY1, a first configuration channel detection module CC1, a second upstream facing port (UFP) physical layer module UFPPHY2, a second configuration channel detection module CC2, a display signal processing module DPP, a USB signal processing module USBP, an image signal output port VDO and a USB signal output port USB3.

The first interface port USB1 is used to connect a first input signal group In1, and the second interface port USB1 is used to connect a second input signal group In2 In the present embodiment, the image processing chip 1 can be applied to, for example, a display or a television. For example, the first interface port USB1 and the second interface port USB2 can be USB Type-C interface ports, the image signal output port VDO can be traces on a PCB or a DP/HDMI connector, and the USB signal output port USB3 can be traces on the PCB. The first input signal group In1 can include a signal group selected from a group consisting of a pair of USB signals, a pair of DisplayPort (DP) signals along with a pair of USB signals, and two pairs of DisplayPort (DP) signals.

In the present embodiment, there are four pairs of high-speed signal channels defined on the existing USB Type-C connector. Generally, there are three types of use of these four pairs of high-speed signal channels, first of which is to define two pairs of high-speed signal channels as DP signals and the other two pairs of high-speed signal are defined as USB signals, second of which is that all four pairs of high-speed signals are defined as DP signals, and third of which is that only two pairs of high-speed signals are defined as USB signals. The image processing chip 1 of the present disclosure is applicable to the above three signal combinations.

Furthermore, the first UFP physical layer module UFPPHY1 is coupled to the first interface port USB1 through a plurality of first high-speed signal channels, such as high-speed channels Rx11, Tx11, Rx12, and Tx12. The first configuration channel detection module CC1 is coupled to the first interface port USB1 through a first configuration channel pair CC11 and CC12. The first configuration channel detection module CC1 communicates via USB to configure a first channel configuration signal of the first input signal group In1 (a detection is performed through the first configuration channel pair CC11 and CC12) to determine a signal type of the first input signal group In1. According to types of the first configuration channel signal provided by the first input signal group In1, it can be discriminated which of the three signal combinations described above the first input signal group In1 is. In more detail, the first configuration channel detection module CC1 first confirms that the first interface port USB1 is connected to a USB device (e.g., a notebook) through voltages of the first configuration channel pair CC11 and CC12, and detects which of the three signal combinations is the first input signal group In1 through a communication of a bi-phase mark coding (BMC) signal on the first configuration channel detection module CC1, thereby determining whether the high-speed channels Rx11, Tx11, Rx12, and Tx12 are DP or USB signals, respectively.

Further, after the signal type is determined, the first configuration channel detection module CC1 controls the first UFP physical layer module UFPPHY1 to output the first input signal group In1 with a first signal configuration according to the signal type of the first input signal group In1. In this case, the first signal configuration defines how to configure the DP signals or USB signals in the four high-speed channels Rx11, Tx11, Rx12, and Tx12. In addition, the first UFP physical layer module UFPPHY1 can convert analog high-speed signals in the first input signal group In1 into digital signals.

Similarly, the second UFP physical layer module UFPPHY1 is coupled to the second interface port USB2 through multiple second high-speed signal channels, such as high-speed channels Rx21, Tx21, Rx22, and Tx22. The second configuration channel detection module CC2 is coupled to the second interface port USB2 through a second configuration channel pair CC21 and CC22. The second configuration channel detection module CC2 communicates via USB to configure a second channel configuration signal of the second input signal group In2 (a detection is performed through the second configuration channel pair CC21 and CC22) to determine a signal type of the second input signal group In2. In this case, according to the signal type of the second configuration channel signal provided by the second input signal group In2, it can be discriminated which of the above three signal combinations the second input signal group In2 is.

After the signal type is determined, the second configuration channel detection module CC2 controls the second UFP physical layer module UFPPHY2 to output the second input signal group In2 with a second signal configuration according to the signal type of the second input signal group In2. In the present embodiment, the second signal configuration defines how to configure the DP signals or USB signals in the four high-speed channels Rx21, Tx21, Rx22, and Tx22, and the second UFP physical layer module UFPPHY2 can convert the second input signal group In2 into digital signals to output the digitized display signals and the digitized USB signals, respectively.

Further, the display signal processing module DPP is configured to receive and process display signals SDP1 and SDP2 respectively from the first UFP physical layer module UFPPHY1 and the second UFP physical layer module UFPPHY2, and generate processed image signals SDP1' and SDP2'. The USB signal processing module USBP is configured to receive and process a plurality of USB signals SUSB1 and a plurality of USB signals SUSB2 respectively from the first UFP physical layer module UFPPHY1 and the second UFP physical layer module UFPPHY2, and generate processed USB signals SUSB1' and SUSB2'.

The image signal output port VDO is configured to output the processed image signals SDP1' and SDP2', and the USB signal output port USB3 is configured to output the processed USB signals SUSB1' and SUSB2'.

Figure 2:
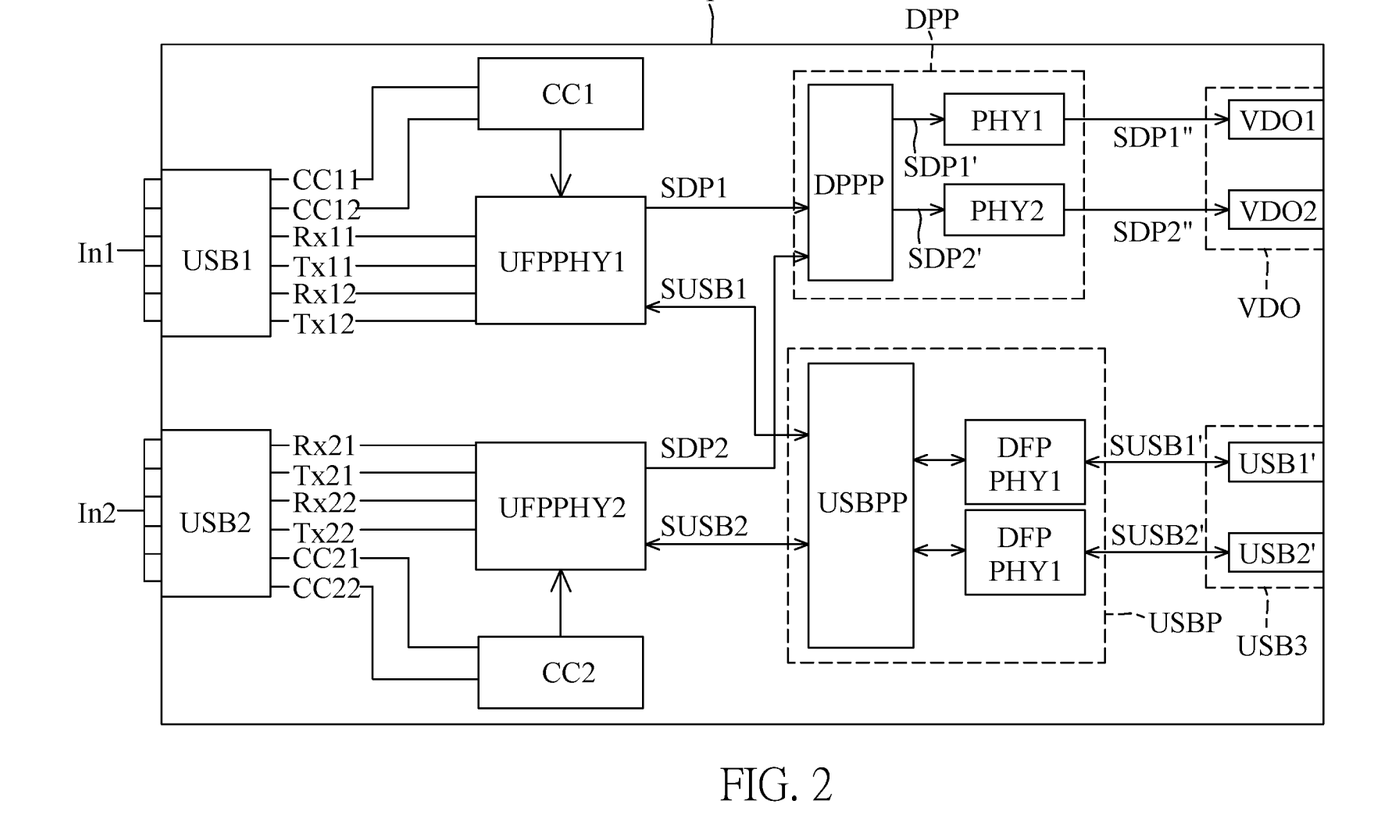
FIG. 2 is another circuit layout diagram of the image processing chip according to the first embodiment of the present disclosure.

Reference is further made to FIG. 2, which is another circuit layout diagram of the image processing chip according to the first embodiment of the present disclosure. FIG. 2 further describes circuit details of the video signal output port VDO, the display signal processing module DPP, the USB signal processing module USBP and the USB signal output port USB3. As shown in FIG. 2, the image signal output port VDO includes a first image signal output interface VDO1 and a second video signal output interface VDO2, and the display signal processing module DPP further includes a display signal digital processing module DPPP, a first physical layer module PHY1, and a second physical layer module PHY2. The display signal digital processing module DPPP is configured to process the digitalized display signals SDP1 and SDP2 of the first UFP physical layer module UFPPHY1 and the second UFP physical layer module UFPPHY2, and generate a plurality of processed image signals SDP1' and SDP2'.

The first physical layer module PHY1 converts the processed image signals SDP1' corresponding to the first input signal group In1 into first format image signals SDP1" according to an interface type of the first image signal output interface VDO1, and sends the first format image signals SDP1" to the first video signal output interface VDO1. The second physical layer module PHY2 converts the processed video signals SDP2' corresponding to the second input signal group In2 into second format image signals SDP2" according to an interface type of the second video signal output interface VDO2, and transmits the second format image signals SDP2" to the second image signal output interface VDO2.

In detail, the digital signal processing module DPPP mainly analyzes the DP signals and sends the analyzed image data to the first physical layer module PHY1 and the second physical layer module PHY2 to be output. The first physical layer module PHY1 and the second physical layer module PHY2 can output signals of different formats according to interface types of the first video signal output interface VDO1 and the second video signal output interface VDO2. For example, if the first image signal output interface VDO1 and the second image signal output interface VDO2 include interfaces with LVDS signal format, the first physical layer module PHY1 and the second physical layer module PHY2 can output image signals with the LVDS format. If the first video signal output interface VDO1 and the second video signal output interface VDO2 include interfaces with DP Tx MST format, the first physical layer module PHY1 and the second physical layer module PHY2 can output signals with the DP Tx MST format.

Figure 3:
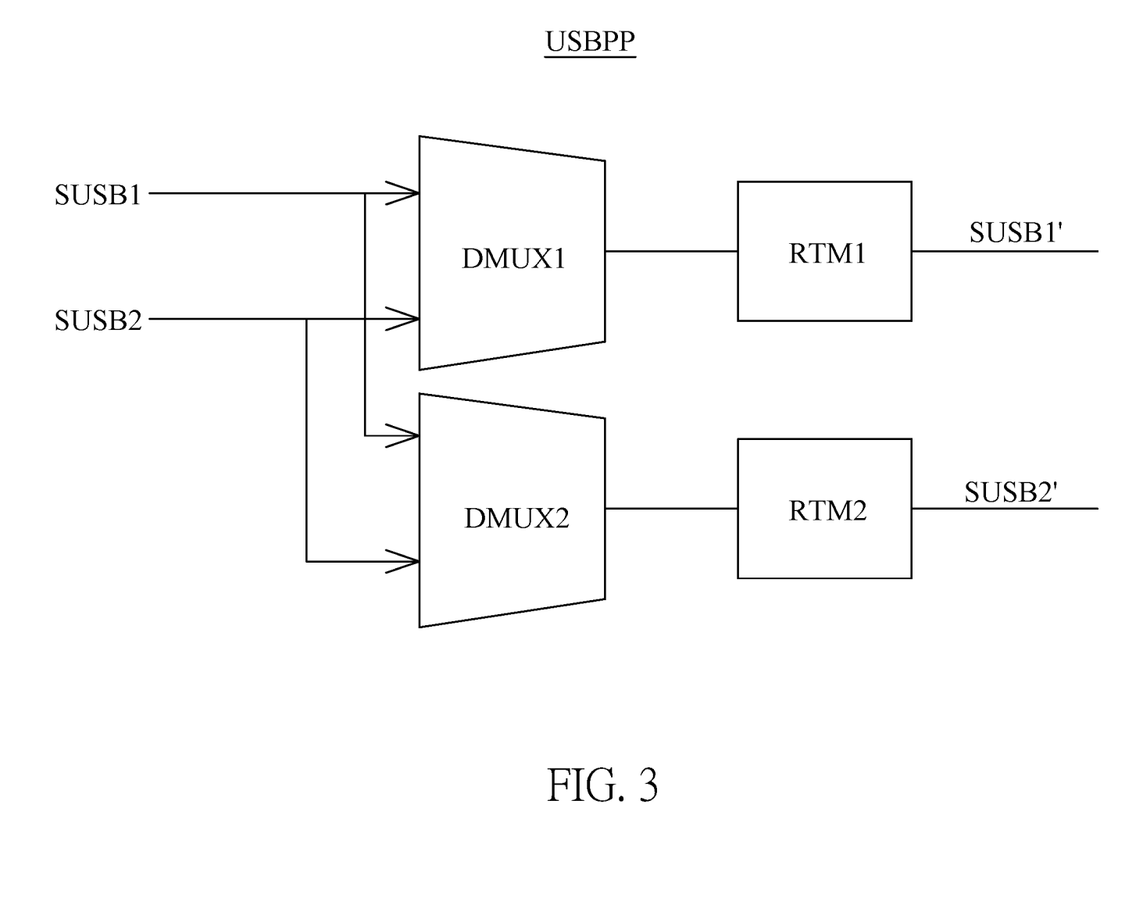
FIG. 3 is a circuit layout diagram of a USB signal processing chip of an image processing chip according to the first embodiment of the present disclosure.

On the other hand, reference can be further made to FIG. 3, which is a circuit layout diagram of a USB signal processing chip of an image processing chip according to the first embodiment of the present disclosure. As shown in FIGS. 2 and 3, the USB signal output port USB3 can include a first USB signal output interface USB1' and a second USB signal output interface USB2', and the USB signal processing module USBP can include a USB signal processing chip USBPP, a downstream facing port (DFP) physical layer module DFPPHY1 and a second downstream port (DFP) physical layer module DFPPHY2. The USB signal processing chip USBPP includes a first digital multiplexer DMUX1, a second digital multiplexer DMUX2, a first retimer RTM1, and a second retimer RTM2.

The first digital multiplexer DMUX1 is configured to receive a USB signal SUSB1 corresponding to the first input signal group In1 from a first input terminal thereof, and receive a USB signal SUSB2 corresponding to the second input signal group In2 from a second input terminal thereof. The first digital multiplexer DMUX1 is configured to selectively output one of the USB signals SUSB1 and SUSB2 corresponding to one of the first input signal group In1 and the second input signal group In2.

Similarly, the second digital multiplexer DMUX2 is configured to receive a USB signal SUSB1 corresponding to the first input signal group In1 from a first input terminal thereof, and receive a USB signal SUSB2 corresponding to the second input signal group In2 from a second input terminal thereof. The second digital multiplexer DMUX2 is configured to selectively output one of the USB signals SUSB1 and SUSB2 corresponding to the first input signal group In1 and the second input signal group In2.

The first retimer RTM1 is configured to receive and enhance the USB signals from the first digital multiplexer DMUX1, and output the enhanced USB signals to the USB signal output port USB3, for example, the first USB signal output interface USB1'. The second retimer RTM2 is configured to receive and enhance the USB signals from the second digital multiplexer DMUX2, and output the enhanced USB signals to the USB signal output port USB3, for example, the second USB signal output interface USB2'.

Here, the first digital multiplexer DMUX1 and the second digital multiplexer DMUX2 enable the first repeater RTM1 and the second repeater RTM2 to respectively select digital signals of the first USB signal output interface USB1' or the second USB signal output interface USB2'. Before the signals are output, the digital signals are transmitted to the first DFP physical layer module DFPPHY1 or the second DFP physical layer module DFPPHY2 selected by the first digital multiplexer DMUX1 and the second digital multiplexer DMUX2.

The first DFP physical layer module DFPPHY1 is configured to receive the USB signals SUSB1' from the first repeater RTM1 and convert the USB signals SUSB1' to analog signals to output to the first USB signal output interface USB1'. The second DFP physical layer module DFPPHY2 is configured to receive the USB signals SUSB2' from the second repeater RTM2, and convert the USB signals SUSB2' into analog signals to output to the second USB signal output interface USB2'.

In detail, in an overall architecture of the image processing chip provided by the present disclosure, the built-in first and second digital multiplexers DMUX1 and DMUX2 play very important roles, which replaces multiple analog multiplexers used in the existing architecture. Therefore, in addition to reducing the area used on the PCB, costs and signal penetrations, the image processing chip of the present disclosure also eliminates needs to use any analog multiplexer, which can reduce speeds of the signals without passing through the analog multiplexer, and thus reduces crosstalk effects caused by the signals, while achieving arbitrary switching between multiple UFPs and multiple DFPs, and the application of the present disclosure is not limited to the form of USB.

Since digital multiplexers are utilized, signals are all switched in a digital domain, issues of crosstalk can be avoided. In addition, the use of the digital multiplexers can achieve noise reduction or noiseless switching, and even error correction can be performed for the first retimer RTM1 and the second retimer RTM2.

Second Embodiment

Figure 4:
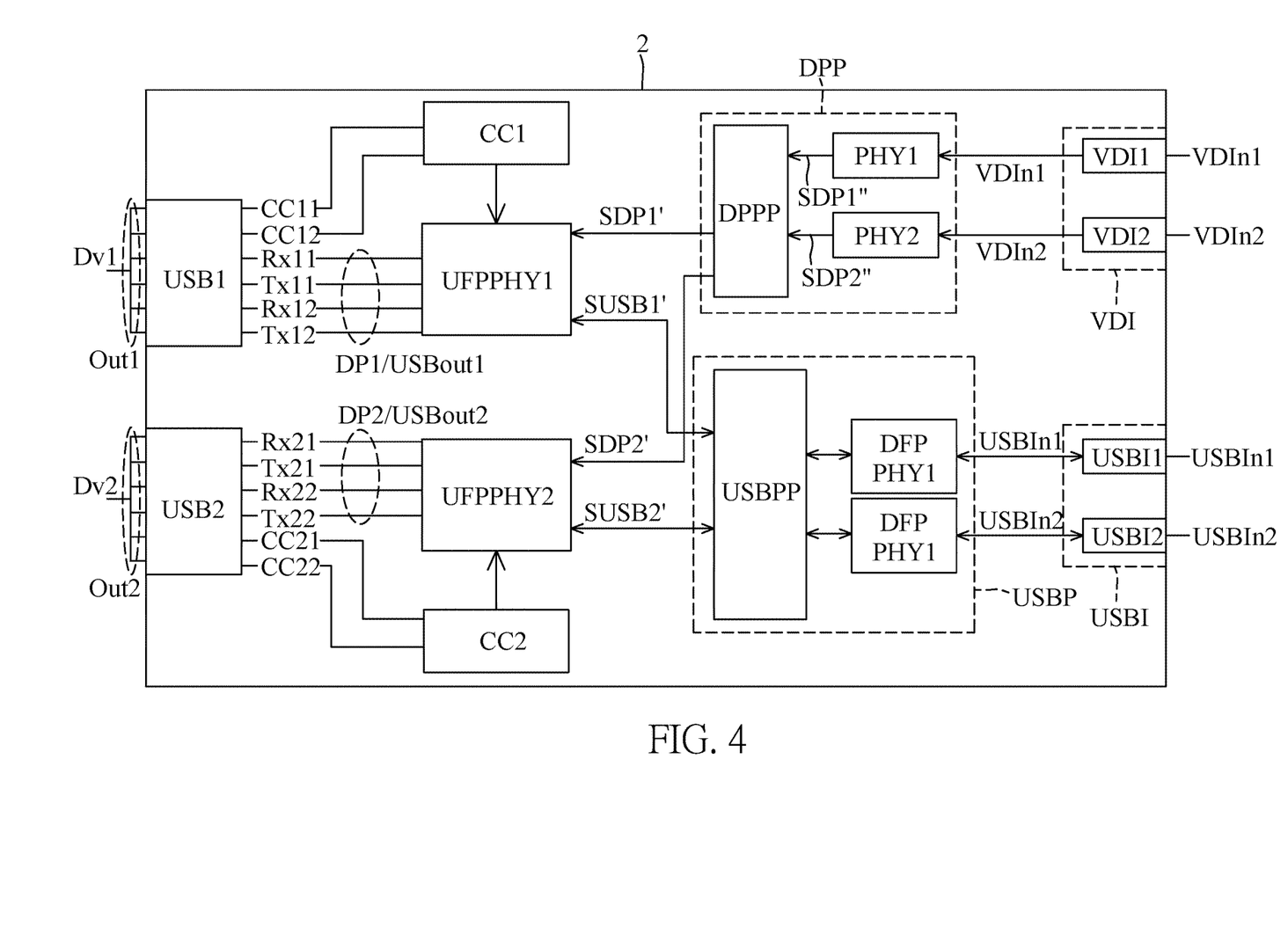
FIG. 4 is a circuit layout diagram of an image processing chip according to a second embodiment of the present disclosure.

FIG. 4 is a circuit layout diagram of an image processing chip according to a second embodiment of the present disclosure. Reference is made to FIG. 4, the second embodiment of the present disclosure provides an image processing chip 2 including a first interface port USB1, a second interface port USB2, a first upstream facing port (UFP) physical layer module UFPPHY1, a first configuration channel detection module CC1, a second upstream facing port (UFP) physical layer module UFPPHY2, a second configuration channel detection module CC2, a display signal processing module DPP, a USB signal processing module USBP, an image signal input port VDI and a USB signal input port USBI.

In this embodiment, the image processing chip 2 can be used as a host side. Therefore, the image processing chip 2 can be applied to, for example, a notebook or a desktop computer. For example, the first interface port USB1 and the second interface port USB2 can be USB Type-C interface ports, and the image signal output port VDO and the USB signal output port USB3 may be traces on a PCB. It should be noted that, in the present embodiment, operation flows of the first configuration channel detection module CC1, the second configuration channel detection module CC2, and the USB signal processing module USBP are the same as described above. Directions are opposite for the display signals, and the first interface port USB1 and the second interface port USB2 become ports for outputting image signals.

In detail, the image signal input port VDI receives a plurality of input display signals. The image signal input port VDI can include a first image signal receiving interface VDI1 and a first video signal receiving interface VDI2, which respectively receive a plurality of first input display signals VDIn1 and a plurality of second input display signals VDIn2 in the input display signals. The USB signal input port USBI receives a plurality of input USB signals. The USB signal input port USBI can include a first USB signal input interface USBI1 and a second USB signal input interface USBI2, which respectively receive a plurality of first input USB signals USBIn1 and a plurality of second input USB signals USBIn2 in the input USB signals.

The display signal processing module DPP is configured to receive and process the input display signals from the video signal input port VDI, for example, the plurality of first input display signals VDIn1 and the plurality of second input display signals VDIn2, and generate a plurality of processed image signals SDP1' and SDP2'.

Similarly, the display signal processing module DPP further includes a first physical layer module PHY1, a second physical layer module PHY2, and a display signal digital processing module DPPP. The first physical layer module PHY1 converts the plurality of first input display signals VDIn1 into a plurality of first format image signals SDP1" according to an interface type of the first interface port USB1, and the second physical layer module PHY2 converts the plurality of second input display signals VDIn2 into a plurality of second format image signals SDP2" according to an interface type of the second interface port USB2.

Furthermore, the display signal digital processing module DPPP is configured to process the first format image signals SDP1" and the second format image signals SDP2" and generate the processed image signals SDP1' and SDP2'.

On the other hand, the USB signal processing module USBP is configured to receive and process the input USB signals from the USB signal input port, such as the first input USB signal USBIn1 and the second input USB signal USBIn2, and generate a plurality of processed USB signals SUSB1' and SUSB2'.

The USB signal processing module USBP further includes a first downstream facing port (DFP) physical layer module DFPPHY1, a second downstream facing port (DFP) physical layer module DFPPHY2, and a USB signal processing chip USBPP. The first DFP physical layer module DFPPHY1 is configured to receive the first input USB signals USBIn1 and convert the first input USB signals USBIn1 into digital signals, and the second DFP physical layer module DFPPHY2 is configured to receive the second input USB signals USBIn2 and convert the second input USB signals USBIn2 into digital signals. The USB signal processing chip is configured to receive the digital signals from the first DFP physical layer module DFPPHY1 and the second DFP physical layer module DFPPHY2 to generate the processed USB signals SUSB1' and SUSB2'.

Figure 5:
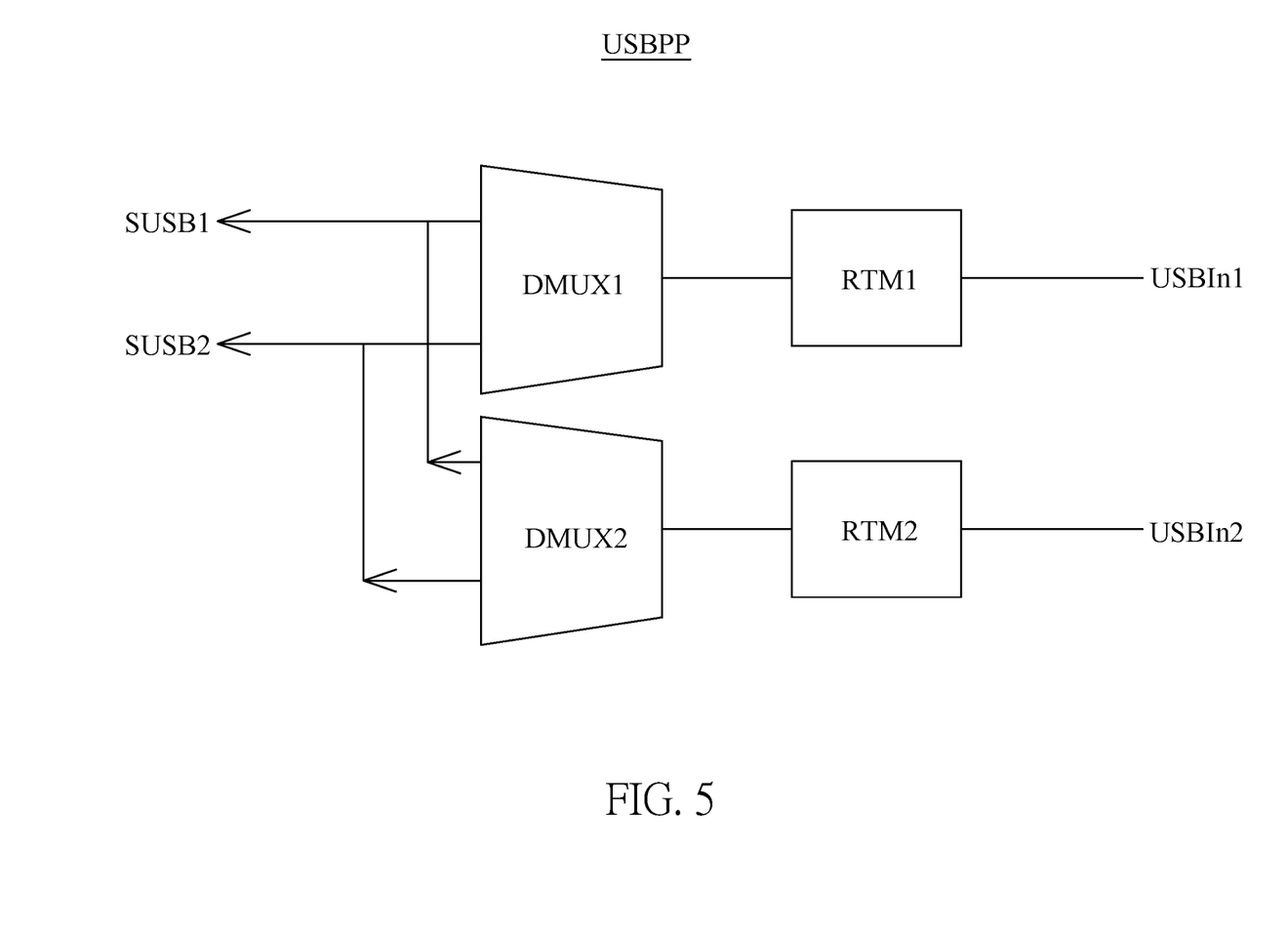
FIG. 5 is a circuit layout diagram of a USB signal processing chip shown by an image processing chip according to the second embodiment of the present disclosure.

Reference can be further made to FIG. 5, which is a circuit layout diagram of a USB signal processing chip shown by an image processing chip according to the second embodiment of the present disclosure. As shown in FIG. 5, the USB signal processing chip USBPP includes a first digital multiplexer DMUX1, a second digital multiplexer DMUX2, a first retimer RTM1, and a second retimer RTM2. The first repeater RTM1 is configured to receive and enhance the first input USB signals USBIn1 from the first DFP physical layer module DFPPHY1, and the second repeater RTM2 is configured to receive and enhance the second input USB signals USBIn2 from the second DFP physical layer module DFPPHY2.

In addition, the first digital multiplexer DMUX1 is configured to receive the first input USB signals USBIn1 from an input thereof, and is configured to selectively output the first input USB signals to a first output terminal or a second output terminal of the first digital multiplexer DMUX1.

The second digital multiplexer DMUX2 is configured to receive the second input USB signals USBIn2 from an input thereof, and is configured to selectively output the second input USB signals to a first output terminal or a second output terminal of the second digital multiplexer DMUX2.

Reference is made to FIG. 4 again, the first interface port USB1 is used for transmitting with a first device Dv1 through a first output signal group Out1. The second interface port USB2 is used for transmitting with a second device Dv2 through a second output signal group Out2.

The first UFP physical layer module UFPPHY1 is configured to receive the processed image signal SDP1' and the processed USB signal SUSB1', and is coupled to the first interface port USB1 through a plurality of first high-speed signal channels, such as high-speed channels Rx11, Tx11, Rx12 and Tx12.

The first configuration channel detection module CC1 is coupled to the first interface port USB1 through the first configuration channel pair CC11 and CC12. The first configuration channel detection module CC1 is configured to detect a first configuration channel signal of the first output signal group Out1 (detection is performed through the first configuration channel pair CC11 and CC12) to determine a signal type of the first output signal group Out1, and control the first UFP physical layer module UFPPHY1 to output a plurality of first image signals DP1 in the processed image signals SDP1' and a plurality of first USB signals USBout1 in the processed USB signals SUSB1' with a first signal configuration as a first output signal group Out1 according to the signal type of the first output signal group Out1.

Similarly, the second UFP physical layer module UFPPHY2 is configured to receive the processed image signals SDP2' and the processed USB signals SUSB2', and is coupled to the second interface port USB2 through a plurality of second high-speed signal channels, such as high-speed channels Rx21, Tx21, Rx22, and Tx22.

The second configuration channel detection module CC2 is coupled to the second interface port USB2 through the second configuration channel pair CC21 and CC22. The second configuration channel detection module CC2 is configured to detect a second configuration channel signal of the second output signal group Out2 (detection is performed through the second configuration channel pair CC21 and CC22) to determine a signal type of the second output signal group Out2, and control the second UFP physical layer module UFPPHY2 to output a plurality of second image signals DP2 of the processed image signals SDP2' and a plurality of second USB signals USBout2 of the processed USB signals SUSB2' in a second signal configuration as the second output signal group Out2 according to the signal type of the second output signal group Out2.

Similarly, the first output signal group Out1 and the second output signal group Out2 can include a signal group selected from a group consist of a pair of USB signals, a pair of DisplayPort (DP) signals along with a pair of USB signals, and two pairs of DisplayPort (DP) signals.

Similarly, when the image processing chip of the present disclosure is applied to a power supply end, the built-in first and second digital multiplexers DMUX1 and DMUX2 replace analog multiplexers used in the existing architecture, thereby reducing the area used on the PCB, costs, and signal penetrations.

In conclusion, in an overall architecture of the image processing chip provided by the present disclosure, the built-in first and second digital multiplexers DMUX1 and DMUX2 play very important roles, which replaces multiple analog multiplexers used in the existing architecture. Therefore, in addition to reducing the area used on the PCB, costs and signal penetrations, the image processing chip of the present disclosure also eliminates needs to use any analog multiplexer, which can reduce speeds of the signals without passing through the analog multiplexer, and thus reduces crosstalk effects caused by the signals, while achieving arbitrary switching between multiple UFPs and multiple DFPs, and the application of the present disclosure is not limited to the form of USB.

Since digital multiplexers are utilized, signals are all switched in a digital domain, issues of crosstalk can be avoided. In addition, the use of the digital multiplexers can achieve noise reduction or noiseless switching, and even error correction can be performed for the first retimer RTM1 and the second retimer RTM2.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An image processing chip, comprising:
    a first interface port for connecting a first input signal group;
    a second interface port for connecting a second input signal group;
    a first upstream facing port (UFP) physical layer module coupled to the first interface port through a plurality of first high-speed signal channels;
    a first configuration channel detection module coupled to the first interface port through a first configuration channel pair, and configured to, after being communicated through a USB specification, detect a first configuration channel signal of the first input signal group to determine a signal type of the first input signal group from three signal combinations, and control the first UFP physical layer module to output the first input signal group with a first signal configuration according to the signal type of the first input signal group, wherein a first signal combination of the three signal combinations defines two pairs of DisplayPort (DP) signals and two pairs of USB signals, a second signal combination of the three signal combinations defines four pairs of DP signals, and a third signal combination of the three signal combinations defines two pairs of USB signals;
    a second upstream facing port (UFP) physical layer module coupled to the second interface port through a plurality of second high-speed signal channels;
    a second configuration channel detection module coupled to the second interface port through a second configuration channel pair, configured to, after being communicated through the USB specification, detect a second configuration channel signal of the second input signal group to determine a signal type of the second input signal group from the three signal combinations, and control the second UFP physical layer module to output the second input signal group with a second signal configuration according to the signal type of the second input signal group;
    a display signal processing module configured to receive and process a plurality of display signals from the first UFP physical layer module and the second UFP physical layer module, and generate a plurality of processed image signals;
    a USB signal processing module configured to receive and process a plurality of USB signals from the first UFP physical layer module and the second UFP physical layer module, and generate a plurality of processed USB signals;
    an image signal output port configured to output the plurality of processed image signals; and
    a USB signal output port configured to output the plurality of processed USB signals,
    wherein the first UFP physical layer module is configured to convert the first input signal group into digital signals, and the second UFP physical layer module is configured to convert the second input signal group into digital signals, so as to output the digitized display signals and the digitized USB signals, respectively.

2. The image processing chip according claim 1, wherein the image signal output port includes a first image signal output interface and a second image signal output interface, and the display signal processing module further includes:
    a display signal digital processing module configured to process the digitized display signals of the first UFP physical layer module and the second UFP physical layer module, and generate the plurality of processed image signals;
    a first physical layer module configured to convert the processed image signals corresponding to the first input signal group into first format image signals according to an interface type of the first image signal output interface and transmit the first format image signals to the first image signal output interface; and
    a second physical layer module configured to convert the processed image signals corresponding to the second input signal group into second format image signals according to an interface type of the second image signal output interface and transmit the second format image signals to the first image signal output interface.

3. The image processing chip according claim 1, wherein the USB signal processing module includes a USB signal processing chip, which includes:
    a first digital multiplexer configured to receive the USB signals corresponding to the first input signal group from a first input terminal thereof, receive the USB signals corresponding to the second input signal group from a second input terminal thereof, and configured to selectively output one of the USB signals corresponding to one of the first input signal group and the second input signal group;

a second digital multiplexer configured to receive the USB signals corresponding to the first input signal group from the first input terminal thereof, receive the USB signals corresponding to the second input signal group from the second input terminal thereof, and configured to selectively output one of the USB signals corresponding to one of the first input signal group and the second input signal group;

a first retimer configured to receive and enhance the USB signals from the first digital multiplexer and output the enhanced USB signals to the USB signal output port; and a second retimer configured to receive and enhance the USB signals from the second digital multiplexer and output the enhanced US signals to the USB signal output port.

4. The image processing chip according to claim 3, wherein the USB signal output port further includes a first USB signal output interface and a second USB signal output interface, and the USB signal processing module further includes:

a first downstream facing port (DFP) physical layer module configured to receive the USB signals from the first retimer and convert the USB signals to analog signals for outputting to the first USB signal output interface; and a second downstream facing port (DFP) physical layer module configured to receive the USB signals from the second retimer and convert the USB signals to analog signals for outputting to the second USB signal output interface.

5. The image processing chip according to claim 1, wherein the first interface port and the second interface port are USB Type-C interface ports, and the first input signal group and the second input signal group respectively include a signal group selected from a group consisting of a pair of USB signals, a pair of DisplayPort (DP) signals along with a pair of USB signals, and two pairs of DisplayPort (DP) signals.

6. An image processing chip, comprising:

an image signal input port configured to receive a plurality of input display signals;

a USB signal input port configured to receive a plurality of input USB signals;

a display signal processing module configured to receive and process the input display signals from the image signal input port, and generate a plurality of processed image signals;

a USB signal processing module configured to receive and process the plurality of input USB signals from the USB signal input port, and generate a plurality of processed USB signals;

a first interface port configured to transmit with a first device through a first output signal group;

a second interface port configured to transmit with a second device through a second output signal group;

a first upstream facing port (UFP) physical layer module configured to receive the plurality of processed image signals and the plurality of processed USB signals, and coupled to the first interface port through a plurality of first high-speed signal channels;

a first configuration channel detection module coupled to the first interface port through a first configuration channel pair, configured to detect a first configuration channel signal of the first output signal group to determine a signal type of the first output signal group from three signal combinations, and control the first UFP physical layer module to output a plurality of first image signals of the plurality of processed image signals and a plurality of first USB signal of the plurality of processed USB signals as the first output signal group with a first signal configuration according to the signal type of the first output signal group, wherein a first signal combination of the three signal combinations defines two pairs of DisplayPort (DP) signals and two pairs of USB signals, a second signal combination of the three signal combinations defines four pairs of DP signals, and a third signal combination of the three signal combinations defines two pairs of USB signals;

a second upstream facing port (UFP) physical layer module configured to receive the plurality of processed image signals and the plurality of processed USB signals, and coupled to the second interface port through a plurality of second high-speed signal channels; and a second configuration channel detection module coupled to the second interface port through a second configuration channel pair, configured to detect a second configuration channel signal of the second output signal group to determine a signal type of the second input signal group from the three signal combinations, and control the second UFP physical layer module to output a plurality of second image signals in the plurality of processed image signals and a plurality of second USB signal in the processed USB signals as the second output signal group with a second signal configuration according to a signal type of the second input signal group, wherein the first UFP physical layer module is configured to convert the plurality of first image signals and the plurality of first USB signals into analog signals, and the second UFP physical layer module is configured to convert the second image signals and the second USB signals into analog signals, thereby outputting the analogized first display signals and the first USB signals to the first interface port, and outputting the analogized second display signals and the second USB signals to the second interface port.

7. The image processing chip according to claim 6, wherein the image signal input port includes a first image signal receiving interface and a second image signal receiving interface for respectively receiving a plurality of first input display signals and a plurality of second input display signal of the plurality of input display signals, and the display signal processing module further includes:

a first physical layer module configured to convert the first input display signals into a plurality of first format image signals according to the interface type of the first interface port;

a second physical layer module configured to convert the second input display signals into a plurality of second format image signals according to the interface type of the second interface port; and a display signal digital processing module configured to process the plurality of first format image signals and the plurality of second format image signals and generate the plurality of processed image signals.

8. The image processing chip according to claim 6, wherein the USB signal input port further includes a first USB signal input interface and a second USB signal input interface for respectively receiving a plurality of first input USB signal and a plurality of second input USB signals of the plurality of input USB signals, and the USB signal processing module further includes:
  a first downstream facing port (DFP) physical layer module configured to receive the first input USB signals and convert the first input USB signals into digital signals; and
  a second downstream facing port (DFP) physical layer module configured to receive the second input USB signals and convert the second input USB signals into digital signals; and
  a USB signal processing chip configured to receive the digital signals from the first DFP physical layer module and the second DFP physical layer module to generate the processed USB signals.

9. The image processing chip according to claim 8, wherein the USB signal processing chip includes:
  a first retimer configured to receive and enhance the first input USB signals; and
  a second retimer configured to receive and enhance the second input USB signals;
  a first digital multiplexer configured to receive the first input USB signals from an input terminal thereof, and configured to selectively output the first input USB signals to a first output terminal or a second output terminal of the first digital multiplexer; and
  a second digital multiplexer configured to receive the second input USB signals from an input terminal thereof, and configured to selectively output the second input USB signals to a first output terminal or a second output terminal of the second digital multiplexer.

10. The image processing chip according to claim 6, wherein the first interface port and the second interface port are USB Type-C interface ports, and the first output signal group and the second output signal group respectively include a signal group selected from a group consisting of a pair of USB signals, a pair of DisplayPort (DP) signals along with a pair of USB signals, and two pairs of DisplayPort (DP) signals.

* * * * *